United States Patent [19]

Dietrich et al.

[11] Patent Number: 4,988,844
[45] Date of Patent: Jan. 29, 1991

[54] PROCESS FOR CONTROLLING THE STRIKE POSITIONS OF A PLURALITY OF ELECTRON BEAMS ON A MELTING BATH

[75] Inventors: Walter Dietrich, Hanau; Horst Ranke, Alzenau; Herman Stumpp, Kahl; Claus Heuser, Alzenau, all of Fed. Rep. of Germany

[73] Assignee: Leybold A.G., Fed. Rep. of Germany

[21] Appl. No.: 480,807

[22] Filed: Feb. 16, 1990

[30] Foreign Application Priority Data

Jul. 19, 1989 [DE] Fed. Rep. of Germany ....... 3923899

[51] Int. Cl.⁵ ............................................. B23K 15/00
[52] U.S. Cl. .............................. 219/121.17; 219/121.28
[58] Field of Search ....................... 219/121.16, 121.17; 373/14, 15, 16

[56] References Cited

U.S. PATENT DOCUMENTS 3,219,435 11/1965 Gruber et al. ............. 219/121.21 X
3,494,804 2/1970 Hanks et al. ........................ 373/16 X
4,843,246 6/1989 Benes et al. ........................ 250/491.1

FOREIGN PATENT DOCUMENTS 1152770 8/1963 Fed. Rep. of Germany .
2846500 5/1979 Fed. Rep. of Germany .
2812285 10/1979 Fed. Rep. of Germany .

*Primary Examiner*—C. L. Albritton
*Attorney, Agent, or Firm*—Eckert Seamans Cherin & Mellott

[57] ABSTRACT

The invention pertains to a process for the control of the strike positions of a plurality of electron beams on a melting bath. In this case, the light beams issuing from the surface of the melting bath are sent to a radiation splitter, the separated beams of which, as the case may be, are sent via additional radiation splitters to photoelectric sensors. The output signals of these sensors are sent to a control, which guides the electron beam guns, from which the electron beams issue.

12 Claims, 2 Drawing Sheets

PROCESS FOR CONTROLLING THE STRIKE POSITIONS OF A PLURALITY OF ELECTRON BEAMS ON A MELTING BATH

BACKGROUND OF THE INVENTION

1. Field Of The Invention

The invention pertains to controlling the strike positions of several electron beams on a melting bath, whereby electromagnetic radiation is concentrated at the strike points.

2. Prior Art

When heating, melting or evaporating metallic or other materials, energy-rich electron beams are often arranged to strike the material to be heated, melted or evaporated. In general, it is necessary in this case to position the electron beam exactly in a predetermined manner. Thus, for example, the evaporation energy sources of the electron beam can be moved over the surface of the material to be evaporated such that as even a surface temperature as possible is reached on a specific surface, and therefore, a constant evaporation rate is maintained. In electron beam melting units, it is important that the electron beam does not strike beside the material to be melted. When electron beam welding guns are used, the electron beam must be guided exactly along the separation line of the parts to be welded.

The electron beam is guided to the desired position in the units mentioned by electric and/or magnetic fields. The position of the strike point of the electron beam is determined by the appropriate dimensioning and adjusting of an electric or magnetic deflecting system as well as by the application of appropriately regulated electric voltage or current to the deflecting system.

During drip melting by means of electron beams, especially where multiple remelting steps are involved, the remelting process is carried out by means of central-vertically guided electrodes and by using several electron beam guns. Modern remelting furnaces are generally limited to two electron beam guns, which are mounted opposite the consumable electrode. This limitation is possible because two semicircular beam distributions guarantee that the consumable electrode and the crucible bath are symmetrically stressed.

A device for the recognition of the strike point of an electron beam is already known, in which the X-rays emitted by a striking electron beam are applied to a lateral diode and cause this diode to produce streams which are directed the X and Y positions of the strike point of the electron beam (EP-A-0,184,680). This device has the advantage of an exact determination of location, but it is relatively expensive and has sensitive components, e.g., thin sheets used as separators between the atmosphere and a vacuum, which represent a certain danger for the safety of the melting process.

Moreover, a vacuum evaporation unit for the discontinuous evaporation of turbine vanes is known, which has a vacuum chamber, in the upper chamber wall of which two electron beam guns are mounted, which are provided with electrical energy through a control unit (DE-A-2,812,285).

As has been determined with such two-gun units, it can happen that in the process of increasing output, the position of beam distribution in the crucible, which is lined up to two semicircular illuminations of the melting bath, moves without a change occurring in the radial deflecting system. The old position of beam distribution in the crucible can be re-established through a manual correction of the radial deflection. This effect, which depends on the material to be melted, is apparently caused by the asymmetrical influence of the ions from the consumable electrode and the melting bath on the beams in the proximity of the melt. The effects occurs, in particular, with initial melts of retracting metals which have a high gas content.

SUMMARY OF THE INVENTION

It is a basic object summary of the invention to determine the beam distribution positions for electron beam melting furnaces with two or more electron beam guns.

This object is achieved by the process of measuring the electromagnetic radiation emitted at the strike points of as many different locations as there are electron beams, dividing the electromagnetic radiation measured into partial beams, and guiding the deflection of the electron beam guns based on a difference of the partial beams.

The advantage obtained by the invention is especially that an automatic re-adjustment of beam distribution is readily possible for units with several electron beam guns.

BRIEF DESCRIPTION OF THE DRAWINGS

An exemplary embodiment of the invention is represented in the drawing and described in detail below.

DETAILED DESCRIPTION OF THE PREFERRED EMBODIMENTS

Figure 1:
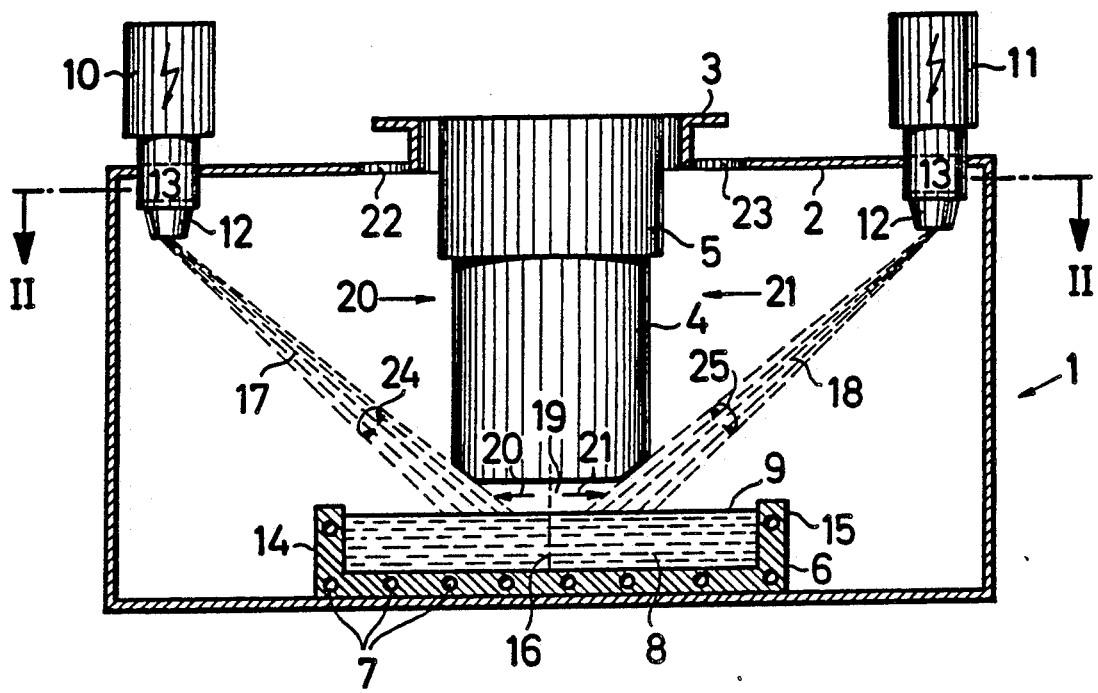
FIG. 1 shows an open side view of an electron beam melting furnace with two electron guns.

FIG. 1 represents a vacuum chamber 1, which has a connecting flange 3 on its upper side 2 for connection to a lock chamber (not shown). An electrode 4, which is attached to a conveyor rod 5, protrudes through the connecting flange 3.

A discharge crucible 6, which is made of copper and has cooling channels 7, is mounted below the electrode 4. A bath of molten evaporate is located in the discharge crucible 6. The bath 8 is limited in its upward direction by a bath level 9. Two electron beam guns 10 and 11 are located in the upper chamber wall 2 of the vacuum chamber 1. The guns 10 and 11 are provided with a magnetic X-deflecting system 12 and a magnetic Y-deflecting system 13 to deflect the beam. The X-deflecting system consists, e.g., of two pole pieces, which enclose an air gap penetrated by field lines. Within this air gap, the electron beam may be deflected by an angle up to ±45°.

For geometric reasons, the magnetic Y-deflecting system 13 only causes a slight beam deflection, and as a result, can be mounted within the electron guns 10 and 11—as indicated by the dashes. Below the discharge crucible 6, a conventional ingot discharge system preferably is provided. The ingot discharge system is, however, not essential to the invention and was therefore omitted from the drawing.

The discharge crucible 6 has a round outline; the two side surface sections being designated as 14 and 15.

Through an axis of symmetry 16, the bath 8 is divided logically into two bath halves.

Above the bath level 9 and to the side beyond the surface sections 14, 15 are located the electron guns 10, 11, the axis of which lie in a symmetrical plane of the crucible 6, which stands at the axis of symmetry 16. The electron beam guns 10, 11 produce electron beam bundles 17 and 18, which, issuing from the x-deflecting system 12, strike electrode 4 and bath level 9 at an angle. By this means, the electrode is melted off through the semicircular paths of the electron beams 17, 18. The electron beam 17 is arranged to the left half of the bath and electron beam 18 is arranged to the right half of the bath as shown.

With the arrangement according to FIG. 1, the effect occurs that the electron beams 17, 18, on the basis of an ion concentration in the area of electrode 4, are shifted in the direction of arrows, 20, 21 toward the electrode. Hereby, the actual radial deflection of the electron beams 17, 18 no longer corresponds to the deflection preset by the x- and y-deflection systems 12, 13, i.e., electrode 4 is no longer melted off in an orderly manner at its lower end by electron beams 17, 18, fanning in a semicircle.

To position the electron beams 17, 18, accurately in their theoretical optimum positions despite the force urging them radially toward the outside, the actual positions of the beams are determined according to the invention and are adjusted according to the theoretical desired positions. To determine the actual value, a special setup 22, 23 is provided, which is described below.

Figure 2:
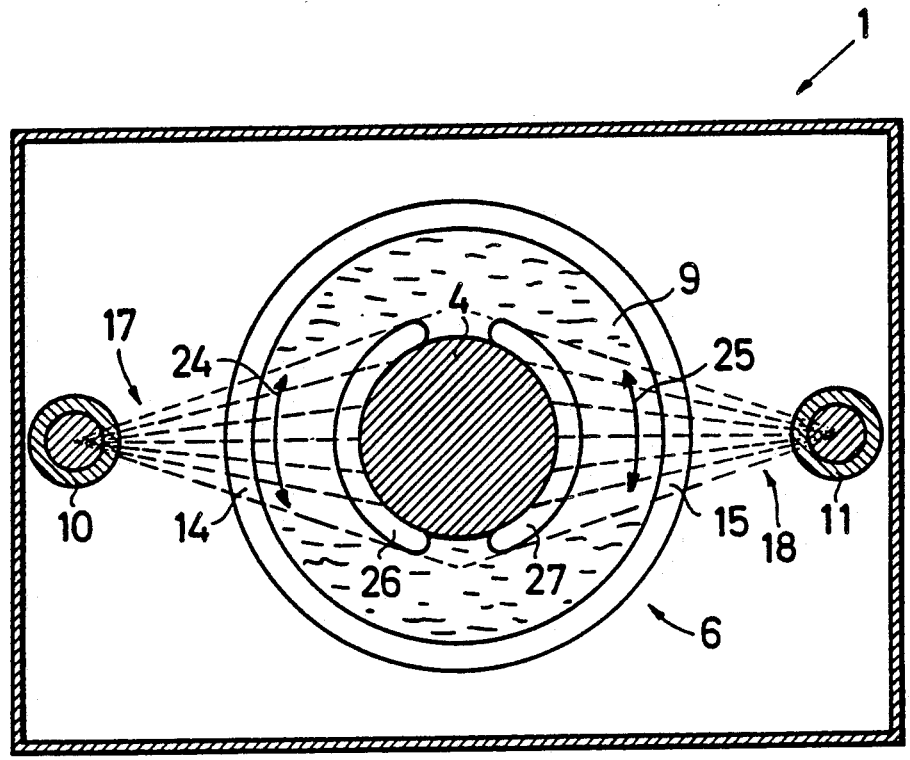
FIG. 2 shows a top view of the melting bath of the electron beam melting furnace shown in FIG. 1.

FIG. 2 represents a top view of the setup according to FIG. 1, and in fact, along a section II—II of FIG. 1. The vacuum chamber 1 with the crucible 6 and consumable electrode 4 are evident. The two side electron beam guns 10, 11, from which the electron beams 17, 18 issue, are likewise evident. The electron beams 17, 18, as arrows 24, 25 indicate, pivot in a semicircle. The areas covered by their strike points are designated 26, 27. These areas, which are exposed to the bombardment of electrons, are particularly brightly illuminated. Their brightness is, in any case, clearly distinct relative to the brightness of the surrounding area.

Figure 3:
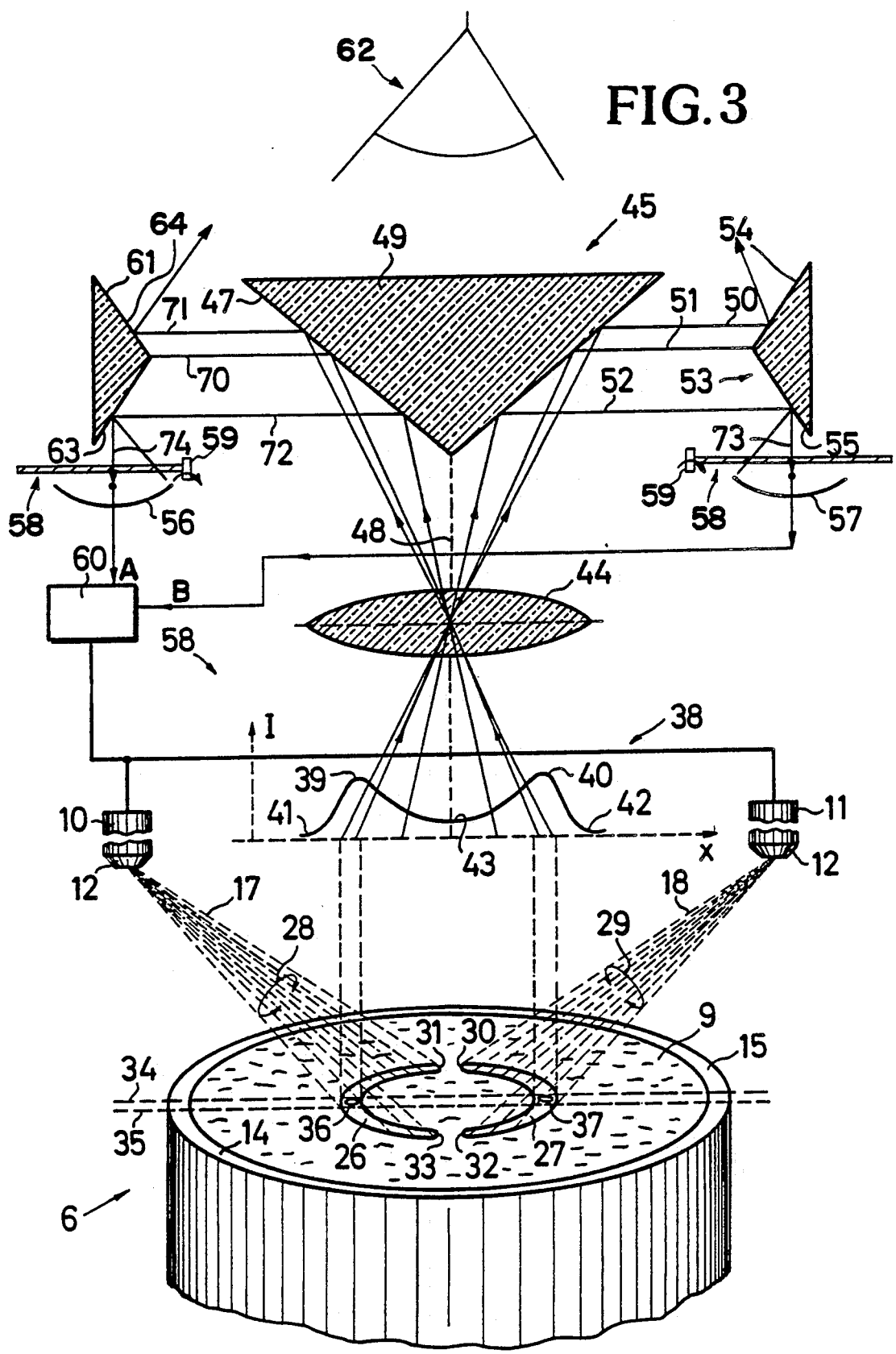
FIG. 3 shows an elementary schematic representation of an optical-electrical plotting switch for the brightness of the melting bath of the electron beam melting furnace according to FIG. 1.

FIG. 3 represents an oblique view of the crucible 6, whereby the semi-circular strike areas 26, 27 of the electron beams 17, 18 are evident, which beams issue from the electron guns 10, 11. As arrows 28, 29 indicate, the electron beams 17, 18 "fan " in a semicircle from one terminal position 30 or 31 to the other terminal position 32, 33.

The semicircular strike areas 26, 27 shine much brighter than those of the surrounding field, so that they are suitable for an optical determination. If the assumption is made that each individual section of the strike areas 26, 27 shines with equal brightness, then it is sufficient to examine such a section only occasionally.

The invention as disclosed herein is a process for controlling positions of strike points of a plurality of electron beams on a melting bath, wherein electromagnetic radiation occurs which is greater at the strike points than in a field surrounding the strike points, including sensing the electromagnetic radiation at as many different locations 26, 27 on a surface 9 of the melting bath 8 as there are electron beams 17, 18. The sensed radiation is divided into partial beams 73, 74. The deflection of the electron beams 17, 18 can thereby be guided based on a difference between the partial beams 73, 74, by positioning the electron beam guns 10, 11, emitting the beams at 17, 18, based on the difference. The electron beams are 17, 18 are applied to the melting bath 8 using at least two electron beam guns 10, 11, symmetrically aligned with a melting electrode 4. The melting electrode 4 is central-vertically positioned relative to the melting bath 8 or its surface 9. The electromagnetic radiation is sensed or registered after issuing from a plane 9 of the melting bath 8 using a device 22 or 23 parallel to the plane of the melting bath 8. Preferably, at least two devices 22, 23 parallel to the plane of the melting bath are used to sense the electromagnetic radiation.

The electromagnetic radiation includes light. The light is divided into quantities 50, 51, 52 ; 70, 71, 72 issuing from a strike point of at least one of the electron beams 17, 18 on the surface of the melting bath 9. The light is divided into at least two partial light quantities 73, 74, which are converted into electrical signals AB, which are compared to one another. The light can be filtered by inserting an optical filter along an optical path between the strike points 26, 27 of the electron beams 17, 18 and a device 44, 45, 53, 60 operable to register light emitted at the strike point. The optical filter preferably accentuates the light intensity emitted from an effective zone of the electron beams 17, 18 on the melting bath 9. A light chopper in the form of a rotating light chopper plate 58 can be inserted along the optical path between the melting bath and the device 56, 57 operable to register the light. Preferably, only light emitted from partial areas 36, 37 of the surface 9 of the melting bath 8 are observed according to the technique of the invention. The partial areas 36, 37 can be defined by areas of lamellar scattering of the electron beams 17, 18 over areas which radiates substantially in a semicircle 26, 27 for each of the electron beams 17, 18.

Preferable, the electromagnetic radiation is divided using a first reflecting prism 45 for dividing into portions the light beams issuing from a radiating point on the melting bath, again dividing into parts of portions of the light from the first reflecting prism 45 and sending one part to an initial photoelectric sensor 57 and another part to be viewed by an observer. A portion of light reflected from the first reflecting prism is also divided into parts using a third reflecting prism 45, a part of this divided light being sent to a subsequent photoelectric sensor 56, and another part to the observer. The output signals AB of the photoelectric sensors 56, 57 can be sent to a comparator 60 establishing a difference (A−B) of the output signals. This different signal is used for steering the electron beam guns 10, 11.

According to the invention, the electron beams can be applied symmetrically to the melting bath n/or electrode, by balancing the position of the electron beam strike points. This process can be accomplished automatically or with monitoring by an observer, or both.

The invention having been disclosed, a number of variations and embodiments will become apparent to persons skilled in the art. Reference should be made to the dependent claims rather than the foregoing specifications as indicating the true scope of the invention in which exclusive rights are claimed.

Such sections 36, 37 are defined by the two lines of dashes 34, 34 in FIG. 3. Above these sections 36, 37, there is a graph diagram 38, which shows the beam intensity distribution I across the horizontal X axis. It is evident that just above the sections 36, 37 the distribution of intensity I in each instance reaches a maximum 39, 40, while the intensity decreases with displacement from sections 36, 37 along the edges 41, 42 and in the middle 43 of the graph.

According to the invention, this distribution of intensity is represented through an optical system, which is symbolized by the lens 44, in an image formed on a prism 45 such that one half of the image appears on one prism edge 46 and the other half of the image appears on the other prism edge 47. The two prism edges 46, 47 lie in mirror symmetry to each other, whereby the vertical axis of symmetry 48 is perpendicular to the base edge 49 of the prism 45. The beams 50, 51, 52, reflected from prism edge 46, are directed to another prism 53, which undertakes a second division of the beam, i.e., one portion of the beams 50, 51, 52 is reflected by prism edge 54, while another portion of these beams 50, 51, 52 is reflected by the other prism edge 55. The intensity of light reflected by prism edge 55 is registered by a photoelectric sensor 57, while the intensity of light reflected by prism edge 54 is presented to the eye 62 of an observer. Prism 61 functions in a corresponding manner, the prism edge 63 of which reflects light onto the sensor 56, while its prism edge 64 reflects light toward the observer's eye 62.

In the beam path between prisms 53, 61 and sensors 56, 57, an additional chopper plate 58 is provided, which rotates on an axis 59 and chops the beam path. It would also be possible, for example to chop the light in front of the lens 44.

Electrical signals A and B supplied by sensors 56, 57 are sent to a comparator 60, which establishes the difference A—B of both signals and steers the radial deflection of the two electron beam guns 10 and 11 with this differential signal.

The beams of the two reflecting prisms 53, 61, which are reflected upward, can be seen by a human observer, symbolized by the eye 62. In this case, a visual comparison of brightness is also possible.

The invention having been disclosed, further embodiment and variations will now be apparent to persons skilled in the art, within the scope of the invention. Reference should be made to the appended claims rather than the foregoing specification, to assess the scope of the subject matter claimed.

We claim:

1. A process for controlling positions of strike points of a plurality of electron beams on a melting bath, wherein electromagnetic radiation occurs which is greater at the strike points than in a field surrounding the strike points, comprising the steps of:
    sensing the electromagnetic radiation at as many different locations on a surface of the melting bath as there are electron beams;
    dividing the electromagnetic radiation into partial beams; and,
    guiding deflection of the electron beams based on a difference between the partial beams.

2. The process according to claim 1, comprising applying the electron beams to the melting bath using at least two electron beam guns which are symmetrically aligned with a melting electrode.

3. The process according to claim 2, wherein the melting electrode is central-vertically positioned relative to the melting bath.

4. The process according to claim 1, comprising registering the electromagnetic radiation issuing from a plane of the melting bath using a device parallel to the plane of the melting bath.

5. The process according to claim 1, comprising registering the electromagnetic radiation issuing from the plane of the melting using at least two devices parallel to the plane of the melting bath.

6. The process according to claim 1, wherein the electromagnetic radiation includes light, and comprising dividing a quantity of light issuing from a strike point of at least one of the electron beams on a surface of the melting bath into at least two partial light quantities, and converting said partial light quantities into electrical signals whereby said light quantities converted into electrical signals can be compared to each other.

7. The process according to claim 6, further comprising filtering the light by inserting an optical filter along an optical path between the strike point of the electron beam on the melting bath and a device operable to register light emitted at the strike point, the optical filter accentuating a light intensity of light emitted from an effective zone of the electron beam on the melting bath, and chopping the light beam issuing from the melting bath using a rotating light chopper plate.

8. The process according to claim 6, further comprising chopping the light along an optical path between the strike point of the electron beam on the melting bath and a device operable to register the light reflected by the strike point, using a rotating light chopper plate.

9. The process according to claim 1, wherein in measuring the electromagnetic radiation, only partial areas of the surface of the melting bath are observed.

10. The process according to claim 9, wherein the partial areas measured are defined by areas of lamellar scattering of the electron beams over areas which radiate substantially in a semicircle.

11. The process according to claim 1, wherein the electromagnetic radiation is divided using a first reflecting prism for dividing into portions light beams issuing from a radiating point on the melting bath and again dividing into parts a portion of light from the first reflecting prism and sending one part to an initial photoelectric sensor and another part to an eye of an observer, and further comprising dividing into parts a portion of light from by the first reflecting prism using a third reflecting prism and sending one part to a subsequent photoelectric sensor and another part to the eye of the observer.

12. The process according to claim 11, comprising sending output signals of the photoelectric sensors to a comparator, establishing a difference of the output signals and steering the electron beam guns using a differential signal therefrom.

* * * * *